(12) United States Patent
Kim et al.

(10) Patent No.: US 6,827,240 B2
(45) Date of Patent: Dec. 7, 2004

(54) LIQUID CRYSTAL DISPENSING APPARATUS

(75) Inventors: Wan-Soo Kim, Gyeonggi-Do (KR); Hyug-Jin Kweon, Kyungsangbuk-Do (KR); Hae-Joon Son, Busan (KR)

(73) Assignee: LG.Philips LCD Co., Ltd., Seoul (KR)

( * ) Notice: Subject to any disclaimer, the term of this patent is extended or adjusted under 35 U.S.C. 154(b) by 51 days.

(21) Appl. No.: 10/329,497

(22) Filed: Dec. 27, 2002

(65) Prior Publication Data

US 2003/0178095 A1 Sep. 25, 2003

(30) Foreign Application Priority Data

Mar. 21, 2002 (KR) ................................ 10-2002-0015451
Mar. 21, 2002 (KR) ................................ 10-2002-0015450

(51) Int. Cl.$^7$ ............................ G02F 1/33; B65D 83/00
(52) U.S. Cl. ..................... 222/394; 222/422; 222/504; 222/511; 222/512; 222/518
(58) Field of Search .................. 222/394, 399, 222/400.5, 420–422, 504, 511, 512, 518

(56) References Cited

U.S. PATENT DOCUMENTS

| | | |
|---|---|---|
| 3,978,580 A | 9/1976 | Leupp et al. |
| 4,094,058 A | 6/1978 | Yasutake et al. |
| 4,653,864 A | 3/1987 | Baron et al. |
| 4,691,995 A | 9/1987 | Yamazaki et al. |
| 4,775,225 A | 10/1988 | Tsuboyama et al. |
| 5,247,377 A | 9/1993 | Omeis et al. |
| 5,263,888 A | 11/1993 | Ishihara et al. |
| 5,379,139 A | 1/1995 | Sato et al. |
| 5,406,989 A * | 4/1995 | Abe ............................ 141/7 |
| 5,499,128 A | 3/1996 | Hasegawa et al. |
| 5,507,323 A | 4/1996 | Abe |
| 5,511,591 A | 4/1996 | Abe |
| 5,539,545 A | 7/1996 | Shimizu et al. |
| 5,548,429 A | 8/1996 | Tsujita |

(List continued on next page.)

FOREIGN PATENT DOCUMENTS

| | | |
|---|---|---|
| EP | 1 003 066 | 5/2000 |
| JP | 51-65656 | 6/1976 |
| JP | 57-38414 | 3/1982 |
| JP | 57-88428 | 6/1982 |
| JP | 58-27126 | 2/1983 |
| JP | 59-57221 | 4/1984 |
| JP | 59-195222 | 11/1984 |
| JP | 60-111221 | 6/1985 |
| JP | 60-164723 | 8/1985 |
| JP | 60-217343 | 10/1985 |
| JP | 61-7822 | 1/1986 |
| JP | 61-55625 | 3/1986 |

(List continued on next page.)

*Primary Examiner*—J. Casimer Jacyna
(74) *Attorney, Agent, or Firm*—Morgan, Lewis & Bockius LLP

(57) ABSTRACT

A liquid crystal dispensing apparatus includes a liquid crystal material container filled with liquid crystal material a gas supply at an upper portion of the liquid crystal material container for pressurizing the liquid crystal material with gas, a needle seat positioned at a lower portion of the liquid crystal material container and having a discharge hole for discharging the liquid crystal material of the liquid crystal material container, a needle having first and second ends positioned within the liquid crystal material container to be movable along upward and downward directions, a first spring positioned at a first end of the needle, a solenoid coil positioned at the upper portion of the liquid crystal material container, a magnetic bar positioned adjacent to the first end of the needle within the solenoid coil for moving the needle along the upward direction by generating a magnetic force when power is applied to the solenoid coil, a second spring positioned around the magnetic bar within the magnetic coil, and a nozzle positioned at the lower portion of the liquid crystal material container for dispensing the liquid crystal material from the liquid crystal material container onto a surface of a substrate.

15 Claims, 9 Drawing Sheets

U.S. PATENT DOCUMENTS

| | | |
|---|---|---|
| 5,642,214 A | 6/1997 | Ishii et al. |
| 5,680,189 A | 10/1997 | Shimizu et al. |
| 5,742,370 A | 4/1998 | Kim et al. |
| 5,757,451 A | 5/1998 | Miyazaki et al. |
| 5,852,484 A | 12/1998 | Inoue et al. |
| 5,854,664 A | 12/1998 | Inoue et al. |
| 5,861,932 A | 1/1999 | Inata et al. |
| 5,875,922 A | 3/1999 | Chastine et al. |
| 5,952,676 A | 9/1999 | Sato et al. |
| 5,956,112 A | 9/1999 | Fujimori et al. |
| 6,001,203 A | 12/1999 | Yamada et al. |
| 6,011,609 A | 1/2000 | Kato et al. |
| 6,016,178 A | 1/2000 | Kataoka et al. |
| 6,016,181 A | 1/2000 | Shimada |
| 6,055,035 A | 4/2000 | von Gutfeld et al. |
| 6,163,357 A | 12/2000 | Nakamura |
| 6,219,126 B1 | 4/2001 | Von Gutfeld |
| 6,226,067 B1 | 5/2001 | Nishiguchi et al. |
| 6,236,445 B1 | 5/2001 | Foschaar et al. |
| 6,304,306 B1 | 10/2001 | Shiomi et al. |
| 6,304,311 B1 | 10/2001 | Egami et al. |
| 6,337,730 B1 | 1/2002 | Ozaki et al. |
| 6,414,733 B1 | 7/2002 | Ishikawa et al. |
| 6,610,364 B1 * | 8/2003 | Kweon et al. ............... 427/256 |
| 2001/0021000 A1 | 9/2001 | Egami |
| 2003/0146297 A1 * | 8/2003 | Jeung et al. ................ 239/288 |
| 2003/0155380 A1 * | 8/2003 | Kim et al. ................... 222/394 |
| 2003/0160115 A1 * | 8/2003 | Kweon et al. ............... 239/569 |
| 2003/0161939 A1 * | 8/2003 | Kweon et al. ................. 427/8 |
| 2003/0169378 A1 * | 9/2003 | Kim et al. .................... 349/20 |
| 2003/0172988 A1 * | 9/2003 | Kweon et al. ............... 141/192 |
| 2003/0178447 A1 * | 9/2003 | Kim et al. ................... 222/394 |
| 2003/0180978 A1 * | 9/2003 | Kweon et al. ................ 438/30 |
| 2003/0184708 A1 * | 10/2003 | Kweon et al. ............... 349/189 |
| 2003/0193628 A1 * | 10/2003 | Kim et al. .................... 349/56 |

FOREIGN PATENT DOCUMENTS

| | | |
|---|---|---|
| JP | 62-89025 | 4/1987 |
| JP | 62-90622 | 4/1987 |
| JP | 62-205319 | 9/1987 |
| JP | 63-109413 | 5/1988 |
| JP | 63-110425 | 5/1988 |
| JP | 63-128315 | 5/1988 |
| JP | 63-311233 | 12/1988 |
| JP | 5-127179 | 5/1993 |
| JP | 5-154923 | 6/1993 |
| JP | 5-265011 | 10/1993 |
| JP | 5-281557 | 10/1993 |
| JP | 5-281562 | 10/1993 |
| JP | 6-51256 | 2/1994 |
| JP | 6-148657 | 5/1994 |
| JP | 6-160871 | 6/1994 |
| JP | 6-235925 | 8/1994 |
| JP | 6-265915 | 9/1994 |
| JP | 6-313870 | 11/1994 |
| JP | 7-84268 | 3/1995 |
| JP | 7-128674 | 5/1995 |
| JP | 7-181507 | 7/1995 |
| JP | 8-95066 | 4/1996 |
| JP | 8-101395 | 4/1996 |
| JP | 8-106101 | 4/1996 |
| JP | 8-171094 | 7/1996 |
| JP | 8-190099 | 7/1996 |
| JP | 8-240807 | 9/1996 |
| JP | 9-5762 | 1/1997 |
| JP | 9-26578 | 1/1997 |
| JP | 9-61829 | 3/1997 |
| JP | 9-73075 | 3/1997 |
| JP | 9-73096 | 3/1997 |
| JP | 9-127528 | 5/1997 |
| JP | 9-230357 | 9/1997 |
| JP | 9-281511 | 10/1997 |
| JP | 9-311340 | 12/1997 |
| JP | 10-123537 | 5/1998 |
| JP | 10-123538 | 5/1998 |
| JP | 10-142616 | 5/1998 |
| JP | 10-177178 | 6/1998 |
| JP | 10-221700 | 8/1998 |
| JP | 10-282512 | 10/1998 |
| JP | 10-333157 | 12/1998 |
| JP | 10-333159 | 12/1998 |
| JP | 11-14953 | 1/1999 |
| JP | 11-38424 | 2/1999 |
| JP | 11-64811 | 3/1999 |
| JP | 11-109388 | 4/1999 |
| JP | 11-133438 | 5/1999 |
| JP | 11-142864 | 5/1999 |
| JP | 11-174477 | 7/1999 |
| JP | 11-212045 | 8/1999 |
| JP | 11-248930 | 9/1999 |
| JP | 11-326922 | 11/1999 |
| JP | 11-344714 | 12/1999 |
| JP | 2000-2879 | 1/2000 |
| JP | 2000-29035 | 1/2000 |
| JP | 2000-56311 | 2/2000 |
| JP | 2000-66165 | 3/2000 |
| JP | 2000-137235 | 5/2000 |
| JP | 2000-147528 | 5/2000 |
| JP | 2000-193988 | 7/2000 |
| JP | 2000-241824 | 9/2000 |
| JP | 2000-284295 | 10/2000 |
| JP | 2000-292799 | 10/2000 |
| JP | 2000-310759 | 11/2000 |
| JP | 2000-310784 | 11/2000 |
| JP | 2000-338501 | 12/2000 |
| JP | 2001-5401 | 1/2001 |
| JP | 2001-5405 | 1/2001 |
| JP | 2001-13506 | 1/2001 |
| JP | 2001-33793 | 2/2001 |
| JP | 2001-42341 | 2/2001 |
| JP | 2001-51284 | 2/2001 |
| JP | 2001-66615 | 3/2001 |
| JP | 2001-91727 | 4/2001 |
| JP | 2001-117105 | 4/2001 |
| JP | 2001-117109 | 4/2001 |
| JP | 2001-133745 | 5/2001 |
| JP | 2001-133794 | 5/2001 |
| JP | 2001-133799 | 5/2001 |
| JP | 2001-142074 | 5/2001 |
| JP | 2001-147437 | 5/2001 |
| JP | 2001-154211 | 6/2001 |
| JP | 2001-166272 | 6/2001 |
| JP | 2001-166310 | 6/2001 |
| JP | 2001-183683 | 7/2001 |
| JP | 2001-201750 | 7/2001 |
| JP | 2001-209052 | 8/2001 |
| JP | 2001-209060 | 8/2001 |
| JP | 2001-215459 | 8/2001 |
| JP | 2001-222017 | 8/2001 |
| JP | 2001-235758 | 8/2001 |
| JP | 2001-255542 | 9/2001 |
| JP | 2001-264782 | 9/2001 |
| JP | 2001-272640 | 10/2001 |
| JP | 2001-281675 | 10/2001 |
| JP | 2001-281678 | 10/2001 |
| JP | 2001-282126 | 10/2001 |
| JP | 2001-305563 | 10/2001 |
| JP | 2001-330837 | 11/2001 |
| JP | 2001-330840 | 11/2001 |
| JP | 2001-356353 | 12/2001 |

| | | | | | | |
|---|---|---|---|---|---|---|
| JP | 2001-356354 | 12/2001 | | JP | 2002-122873 | 4/2002 |
| JP | 2002-14360 | 1/2002 | | JP | 2002-139734 | 5/2002 |
| JP | 2002-23176 | 1/2002 | | JP | 2002-202512 | 7/2002 |
| JP | 2002-49045 | 2/2002 | | JP | 2002-202514 | 7/2002 |
| JP | 2002-82340 | 3/2002 | | JP | 2002-214626 | 7/2002 |
| JP | 2002-90759 | 3/2002 | | KR | 2000-0035302 | 6/2000 |
| JP | 2002-90760 | 3/2002 | | | | |
| JP | 2002-107740 | 4/2002 | | | | |
| JP | 2002-122872 | 4/2002 | | | | |

\* cited by examiner

LIQUID CRYSTAL DISPENSING APPARATUS

The present invention claims the benefit of Korean Patent Application Nos. 15450/2002 and 15451/2002 both filed in Korea on Mar. 21, 2002, which are hereby incorporated by reference.

BACKGROUND OF THE INVENTION

1. Field of the Invention

The present invention relates to a liquid crystal dispensing apparatus, and in particular, to a liquid crystal dispensing apparatus capable of dispensing an accurate amount of liquid crystal onto a substrate and distributing the dispensed liquid crystal onto the substrate.

2. Description of the Related Art

Currently, the development of various portable electronic equipment, such as mobile phones, personal digital assistants (PDAs), and notebook computers, require flat panel display devices having light weight, small size, and adaptability to portable electronic equipment. Various different types of flat panel display devices have been developed for these portable electronic equipment including liquid crystal display (LCDs), plasma display panels (PDPs), field emission display (FEDs), and vacuum fluorescent displays (VFDs).

FIG. 1 is a cross sectional view of a liquid crystal display device according to the related art. In FIG. 1, a LCD 1 includes a lower substrate 5, an upper substrate 3, and liquid crystal material layer 7 arranged between the lower substrate 5 and the upper substrate 3. The lower substrate 5 is a driving element array substrate having a plurality of pixel regions formed on an inner surface thereof. A driving element, such as a TFT (thin film transistor), is formed within each of the pixel regions. The upper substrate 3 is a color filter substrate, and includes a color filter layer formed on an inner surface thereof for producing colored light. In addition, a pixel electrode and a common electrode are formed on the lower substrate 5 and the upper substrate 3, respectively, and an alignment layer for aligning liquid crystal molecules of the liquid crystal material layer 7 is coated on the lower substrate 5 and the upper substrate 3.

The lower substrate 5 and the upper substrate 3 are bonded each other by a sealing material 9, and the liquid crystal material of the liquid crystal material layer 7 is disposed therebetween. Accordingly, information is displayed by controlling an amount of light transmitted through the liquid crystal material layer 7 by driving the liquid crystal molecules with the driving element formed on the lower substrate 5.

A fabrication process of a liquid crystal display device can be divided into a driving element array substrate process for forming a driving element on the lower substrate 5, a color filter substrate process for forming a color filter on the upper substrate 3, and a cell formation process.

FIG. 2 is a flow chart of a liquid crystal display device fabrication method for forming the liquid crystal display device of FIG. 1 according to the related art. In step S101, a TFT array process is performed to include a plurality of gate lines and data lines (not shown) arranged on the lower substrate 5, thereby defining a plurality of pixel regions. In addition, a TFT is connected to the gate and data lines formed within each of the pixel regions to function as a driving element. Furthermore, a pixel electrode that contacts the TFT and drives the liquid crystal material layer 7 according to a signal applied through the TFT is formed by the driving element array process.

In step S104, red, green, and blue color filter layers and a common electrode are formed on the upper substrate 3 by the color filter process to generate colored light.

In step S102, a coating process includes forming an alignment layer on the lower substrate 3 to induce a surface anchoring (i.e., a pretilt angle and an alignment direction) to liquid crystal molecules of a liquid crystal material layer 7 formed between the upper and lower substrates 3 and 5. Then, the alignment layer formed on the lower substrate 3 is rubbed.

In step S105, an additional coating process includes forming an alignment layer on the upper substrate 5 to induce a surface anchoring (i.e., a pretilt angle and an alignment direction) to liquid crystal molecules of a liquid crystal material layer 7 formed between the upper and lower substrates 3 and 5. Then, the alignment layer formed on the upper substrate 5 is rubbed.

In step S103, spacers are uniformly dispersed on the lower substrate 5 to maintaining a uniform cell gap between the upper and lower substrates 3 and 5.

In step S105, a sealing material 9 is coated onto the upper substrate 3.

In step S107, the upper and lower substrates 3 and 5 are bonded together under pressure.

In step S108, the bonded upper and lower substrates 3 and 5 are cut and processed to form a plurality of individual liquid crystal display cells.

In step S109, liquid crystal material is injected into each of the individual liquid crystal display cells via a liquid crystal injection hole. Then, each of the individual liquid crystal display cells is encapsulated.

In step S110, each of the encapsulated individual liquid crystal display cells is inspected.

FIG. 3 is a cross sectional view of a liquid crystal injecting apparatus according to the related art. In FIG. 3, a container 12 containing liquid crystal material 14 is disposed within a vacuum chamber 10, and a liquid crystal panel 1 is placed above the container 12. In addition, a liquid crystal panel mover (not shown) is disposed within the vacuum chamber 10 to move the liquid crystal panel 1 into the container 12, thereby making contact between the liquid crystal material 14 and a liquid crystal injection hole 16 of the liquid crystal panel 1. In general, this method is commonly referred to as a liquid crystal dipping injection method.

Then, the pressure within the vacuum chamber 10 is increased by supplying nitrogen ($N_2$) gas into the interior of the vacuum chamber 10. Accordingly, the liquid crystal material 14 is injected into the liquid crystal panel 1 through the liquid crystal injection hole 16 due to a pressure difference between the liquid crystal panel 1 and the vacuum chamber 10. Then, after the liquid crystal material 14 completely fills the liquid crystal panel 1, the liquid crystal injection hole 16 is sealed by a sealing material and a liquid crystal material layer is formed inside of the liquid crystal panel 1. In general, this method is commonly referred to as a liquid crystal vacuum injection method.

However, the liquid crystal vacuum injection method is problematic. First, a total processing time for completely injecting the liquid crystal material 14 into the liquid crystal panel 1 through the liquid crystal injection hole 16 requires a significant amount of time. Generally, since an interval between the driving element array substrate (i.e., lower substrate 5 in FIG. 1) and the color filter substrate (i.e., upper substrate 3 in FIG. 1) of the liquid crystal panel 1 is about a few $\mu$m, a very small amount of liquid crystal material 14 per unit time is injected into the liquid crystal panel 1. For example, during fabrication of a 15 inch liquid crystal panel, total processing time for completely injecting the liquid crystal material 14 into the liquid crystal panel 1 may be 8 hours. Accordingly, fabrication efficiency of the liquid crystal panel 1 is low.

Second, a liquid crystal material consumption rate is very high. Compared to the amount of the liquid crystal material 14 placed into the container 12, the amount of liquid crystal material 14 actually injected into the liquid crystal panel 1 is very small. Moreover, when the liquid crystal material 14 is exposed to the atmosphere air or to certain gases, the liquid crystal material reacts deteriorates. Furthermore, the liquid crystal material 14 deteriorates by the flow of impurities during contact with the liquid crystal panel 1. Thus, any of the liquid crystal material 14 that remains in the container 12 after injection into each liquid crystal panel 1 must be discarded. Accordingly, productions costs are increased.

SUMMARY OF THE INVENTION

Accordingly, the present invention is directed to a liquid crystal dispensing apparatus that substantially obviates one or more of the problems due to limitations and disadvantages of the related art.

An object of the present invention is to provide a liquid crystal dispensing apparatus capable of cleanly dispensing liquid crystal material directly onto substrates of a liquid crystal display panel.

Another object of the present invention is to provide a liquid crystal dispensing apparatus capable of improving a liquid crystal material dispensing accuracy on substrates of a liquid crystal display panel.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a liquid crystal dispensing apparatus includes a liquid crystal material container filled with liquid crystal material a gas supply at an upper portion of the liquid crystal material container for pressurizing the liquid crystal material with gas, a needle seat positioned at a lower portion of the liquid crystal material container and having a discharge hole for discharging the liquid crystal material of the liquid crystal material container, a needle having first and second ends positioned within the liquid crystal material container to be movable along upward and downward directions, a first spring positioned at a first end of the needle, a solenoid coil positioned at the upper portion of the liquid crystal material container, a magnetic bar positioned adjacent to the first end of the needle within the solenoid coil for moving the needle along the upward direction by generating a magnetic force when power is applied to the solenoid coil, a second spring positioned around the magnetic bar within the magnetic coil, and a nozzle positioned at the lower portion of the liquid crystal material container for dispensing the liquid crystal material from the liquid crystal material container onto a surface of a substrate.

In another aspect, a liquid crystal dispensing apparatus includes a liquid crystal container filled with liquid crystal material, a gas supply at an upper portion of the liquid crystal material container for pressurizing the liquid crystal material with gas, a needle seat positioned at a lower portion of the liquid crystal container, a discharge hole formed in the needle seat for discharging the liquid crystal material, the discharge hole having a first magnetic force, a needle positioned within the liquid crystal material container to be movable along upward and downward directions, the needle having first and second ends such that the first end opens and closes the discharge hole according to a magnetic force formed at the second end, a solenoid coil and a magnetic bar positioned adjacent to the second end of the needle for moving the needle along the upward direction by application of a second magnetic force to the second end of the needle, and a nozzle positioned at a lower portion of the liquid crystal material container for dispensing the liquid crystal material onto a surface of a substrate.

In another aspect, a liquid crystal dispensing apparatus includes a liquid crystal material container filled with liquid crystal material and pressurized with gas supplied at an upper space of the liquid crystal material container, a needle seat positioned at a lower portion of the liquid crystal container and having a discharge hole for discharging the liquid crystal material, a needle positioned within the liquid crystal container to be movable along upward and downward directions, the needle having first and second ends such that the first end opens and closes the discharge hole according to a first magnetic force generated at the first and second ends of the needle, a solenoid coil positioned above the second end of the needle, a magnetic bar positioned above the needle for moving the needle along the upward direction by generating a second magnetic force when power is supplied to the solenoid coil, and a nozzle positioned at a lower portion of the liquid crystal container for dispensing the liquid crystal material onto a substrate having at least one panel.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
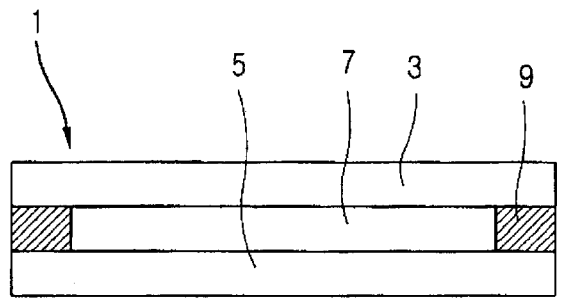
FIG. 1 is a cross sectional view of a liquid crystal display device according to the related art.
Figure 2:
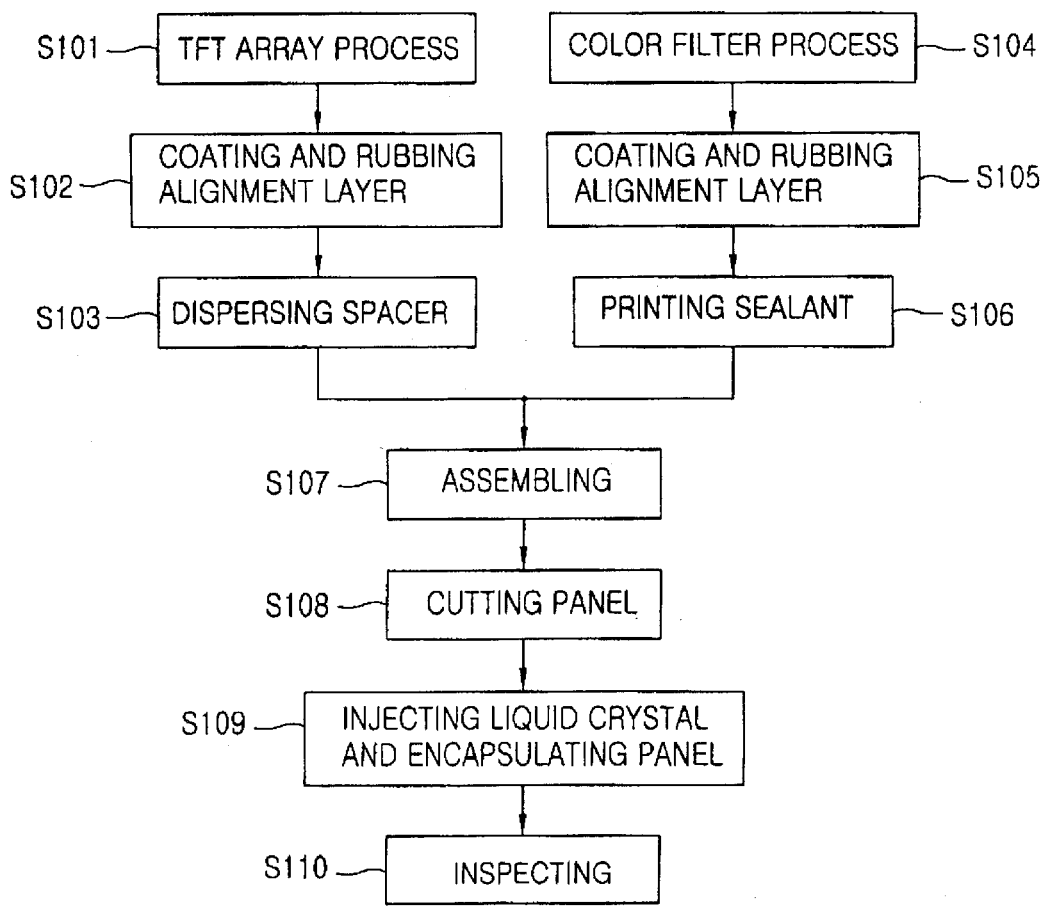
FIG. 2 is a flow chart of a liquid crystal display device fabrication method for forming the liquid crystal display device of FIG. 1 according to the related art.
Figure 3:
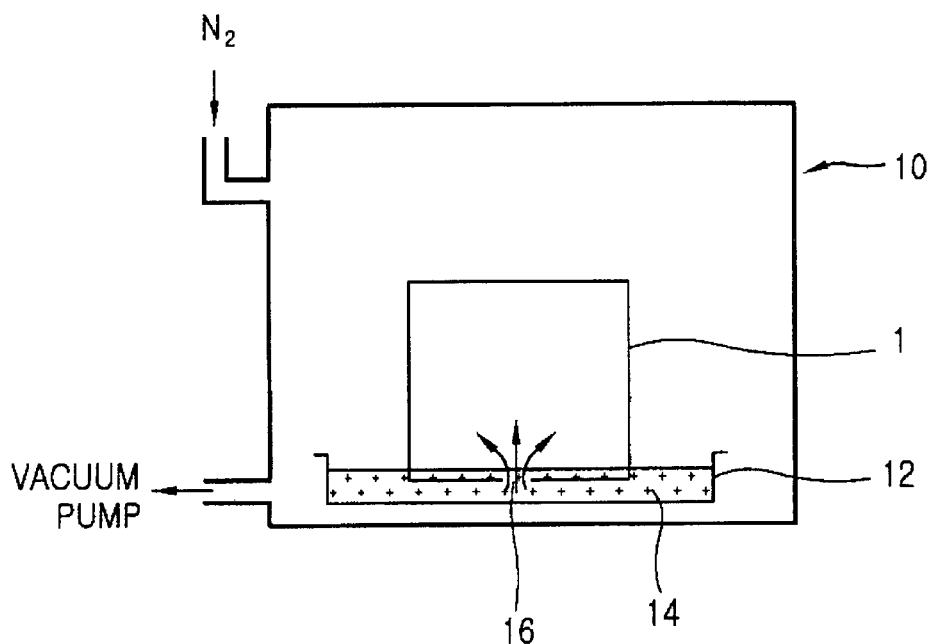
FIG. 3 is a cross sectional view of a liquid crystal injecting apparatus according to the related art.
Figure 4:
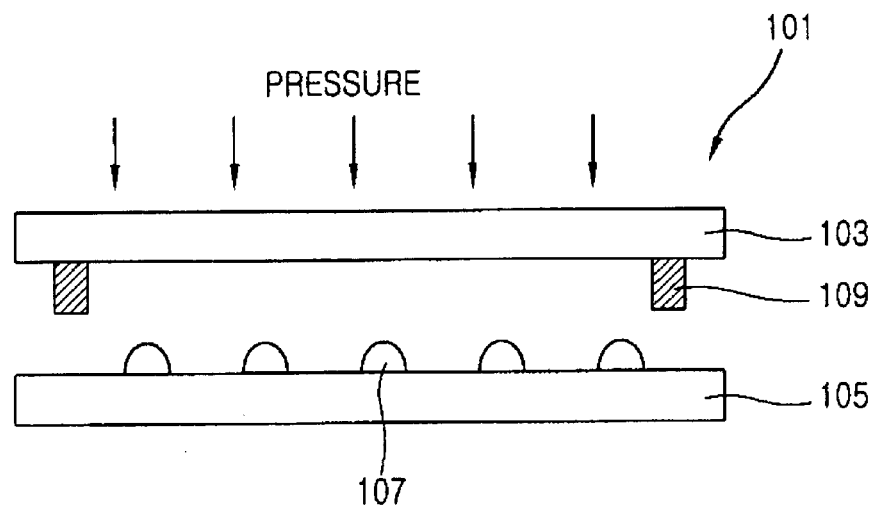
FIG. 4 is a cross sectional view of a liquid crystal display device fabricated by an exemplary liquid crystal dispensing method in accordance with the present invention.

FIG. 4 is a cross sectional view of a liquid crystal display device fabricated by an exemplary liquid crystal dispensing method in accordance with the present invention. In FIG. 4, before a lower substrate 105 having a plurality of driving elements (i.e. TFT substrate) and an upper 103 having a plurality of color filters (i.e., CF substrate) are bonded together, liquid crystal material 107 may be dispensed onto a surface of the lower substrate 105 having the driving elements as a serial of drops spaced at uniform intervals. Alternatively, or in addition to, the liquid crystal 107 may be dispensed onto a surface of the upper substrate 103 having the color filters. In addition, a sealing pattern 109 may be formed along an outer perimeter of the lower substrate. Alternatively, the sealing pattern may be formed along a perimeter of the lower substrate 105. Moreover, the sealing pattern 109 may be formed on both the upper and lower substrates 103 and 105. Furthermore, the sealing pattern 109 may include a plurality of concentric columns formed on the perimeter of the upper and/or lower substrates 103 and 105. During the liquid crystal dispensing method, any one of the TFT substrate and the CF substrate can be an object upon which the liquid crystal material 107 may be dispensed. However, which ever of the upper and lower substrates 103 and 105 is to receive the liquid crystal material 107 should be positioned as the lower substrate. Alternatively, depending on a viscosity of the liquid crystal material 107, the liquid crystal material 107 may be dispensed on the upper and/or lower substrates 103 and 105.

Next, the upper and lower substrates 103 and 105 may be aligned with each and bonded together. Accordingly, the liquid crystal material 107 may flow between the upper and lower substrates 103 and 105 by application of pressure to the upper and lower substrates 103 and 105. Thus, a uniform thickness of the liquid crystal material layer may be formed between the upper and lower substrates 103 and 105.

Figure 5:
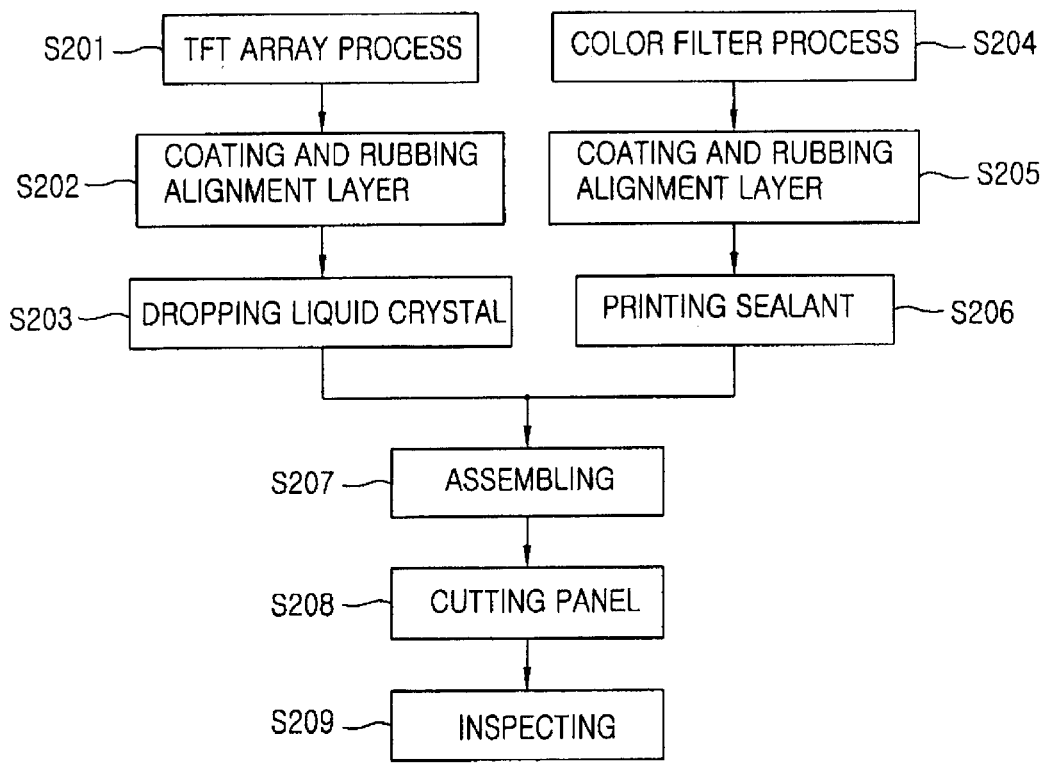
FIG. 5 is a flow chart of an exemplary fabrication process of a liquid crystal display device in accordance with the present invention.

FIG. 5 is a flow chart of an exemplary fabrication process of the liquid crystal display device of FIG. 4 in accordance with the present invention. In FIGS. 4 and 5, a step S201 may include forming a TFT array on the lower substrate 105 during a TFT array process, and a step S204 may include forming a color filter layer on the upper substrate 103 during a color filter process.

In a step S202, an alignment layer may be coated onto the lower substrate 105 having the TFT array. Next, a rubbing process may be performed on the alignment layer coated on the lower substrate 105.

In a step S205, another alignment layer may be coated onto the upper substrate 103 having the color filter layer. Next, a rubbing process may be performed upon the alignment layer on the upper substrate 103.

In a step S203, liquid crystal material may be dropped onto a surface of the lower substrate 105 having the TFT array at equal intervals. Alternatively, the liquid crystal material may be dropped onto the surface of the lower substrate 105 at groups of equal first intervals, wherein the groups are spaced apart by second intervals unequal to the first intervals to accommodate large substrates having a plurality of individual display panel regions.

In a step S206, the sealant pattern 109 may be formed by coating a sealant material or sealant materials along a perimeter of the upper substrate 103. Alternatively, the sealant pattern 109 may include a plurality of sealant patterns formed a plurality of regions on the upper substrate 103 to accommodate large substrates having a plurality of individual display panel regions. Moreover, the sealant pattern 109 may be formed on both the upper and lower substrates 109. In addition, the sealant pattern 109 may include a plurality of sealant patterns formed concentrically around the upper substrate 109, or concentrically around each of the plurality of individual display panel regions.

In a step S07, the upper and lower substrates 103 and 105 may be aligned and bonded together by application of pressure upon the upper substrate 103 and the lower substrate 105. Accordingly, the sealing pattern 109 formed the upper substrate 105 and/or the lower substrate 103 may mechanically bond the upper and lower substrates 103 and 105 together. During the application of pressure, the liquid crystal material 107 may flow uniformly along an entire width of the bonded upper and lower substrates 103 and 105. Alternatively, the liquid crystal material 107 may flow uniformly within each of the individual display panel regions.

In a step S208, the bonded upper and lower substrates 103 and 105 may be divided into a plurality of individual display panel cells corresponding to the plurality of display panel regions. During the step S208, the plurality of individual display panel cells may be formed using a cutting tool to scribe a line across an outer surface of one of the upper and lower substrates 103 and 105. Alternatively, outer surfaces of both the upper and lower substrates 103 and 105 may be scribed with a line.

In a step S209, each of the individual display panel cells may be inspected for defects. For example, each of the individual display panel cells may be held up to light to ensure even distribution of the liquid crystal material 107 between the upper and lower substrates 103 and 105. In addition, surface defects of the bonded upper and lower substrates 103 and 105 may be performed. Alternatively, or in addition to the step S209, the inspection process may be performed prior to the dividing of the individual liquid crystal display cells.

During the above-described fabrication process, positioning for dispensing the liquid crystal material and a dispensing amount of the liquid crystal material may be critical in forming a liquid crystal material layer of a precise thickness. In particular, since a thickness of the liquid crystal material layer may be directly related to a cell gap of the liquid crystal panel, an accurate liquid crystal dispensing position and dispensing amount may be important factors for preventing formation of defects in the liquid crystal panel. Accordingly, an apparatus for dispensing a precise amount of liquid crystal material at an accurate position may be required.

Figure 6:
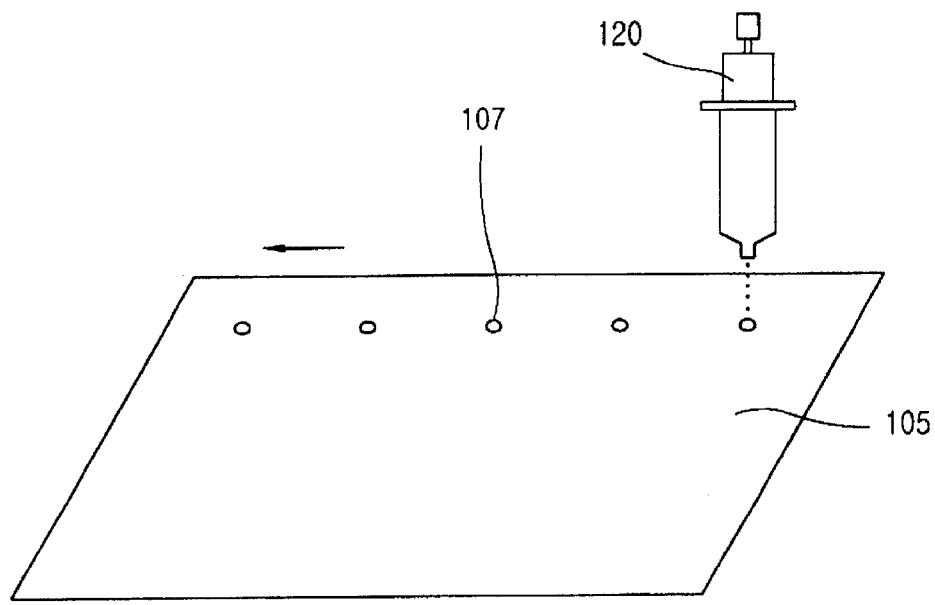
FIG. 6 is a perspective view of an exemplary liquid crystal dispensing method in accordance with the present invention.

FIG. 6 is a perspective view of an exemplary liquid crystal dispensing method in accordance with the present invention. In FIG. 6, a liquid crystal dispensing apparatus 120 may be installed above a substrate 105. The liquid crystal dispensing apparatus 120 maybe filled with liquid crystal material 107 to dispense a specific amount of the liquid crystal material 107 onto the substrate 105. The liquid crystal material 107 may be dispensed onto the substrate 105 as a drop shape.

Next, the substrate 105 may be moved along both X-axis and Y-axis directions at a constant rate, and the liquid crystal dispensing apparatus 120 may remain stationary to discharge the liquid crystal material 107 at specific time intervals. Accordingly, the liquid crystal material 107 may be dispensed onto the substrate 105 at regular intervals along the X-axis and Y-axis directions. Alternatively, the substrate 105 may remain stationary and the liquid crystal dispensing apparatus 120 may be moved along the X-axis and Y-axis directions to dispense the liquid crystal material 107 onto the substrate 105a t regular intervals. Moreover, both the substrate 105 and the liquid crystal dispensing apparatus 120 may be moved along the X-axis and Y-axis directions to dispense the liquid crystal material 107 onto the substrate 105 at regular intervals. However, it may be preferable to keep the liquid crystal dispensing apparatus 120 stationary and move the substrate 105 along the X-axis and Y-axis directions.

Alternatively, the liquid crystal material 107 may be dropped onto the surface of the substrate 105 at groups of equal first intervals, wherein the groups are spaced apart by second intervals unequal to the first intervals to accommodate large substrates having a plurality of individual display panel regions. Accordingly, the liquid crystal material 107 may be dropped onto the surface of the substrate 105 in almost any interval geometry.

Figure 7A:
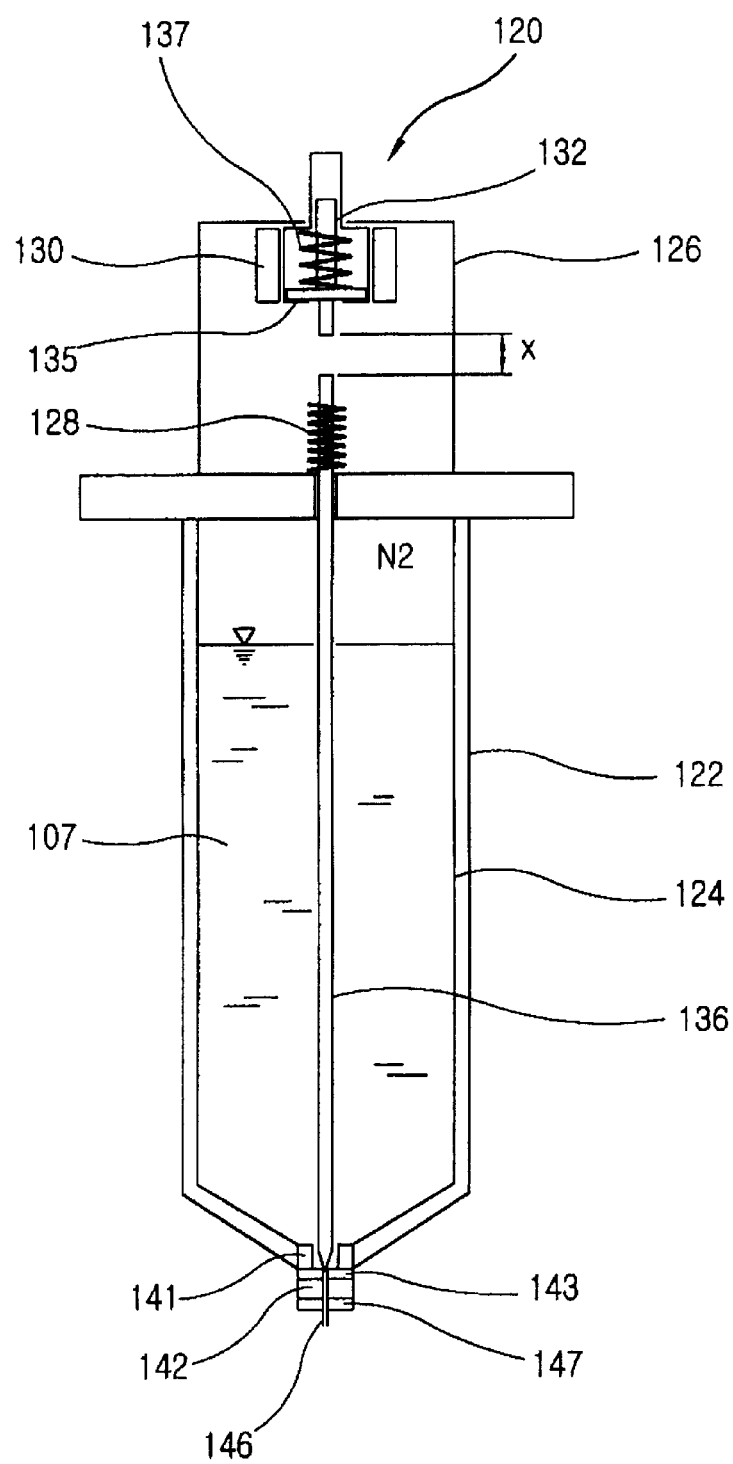
FIG. 7A is a cross sectional view of an exemplary liquid crystal dispensing apparatus prior to injecting of liquid crystal material in accordance with the present invention.
Figure 7B:
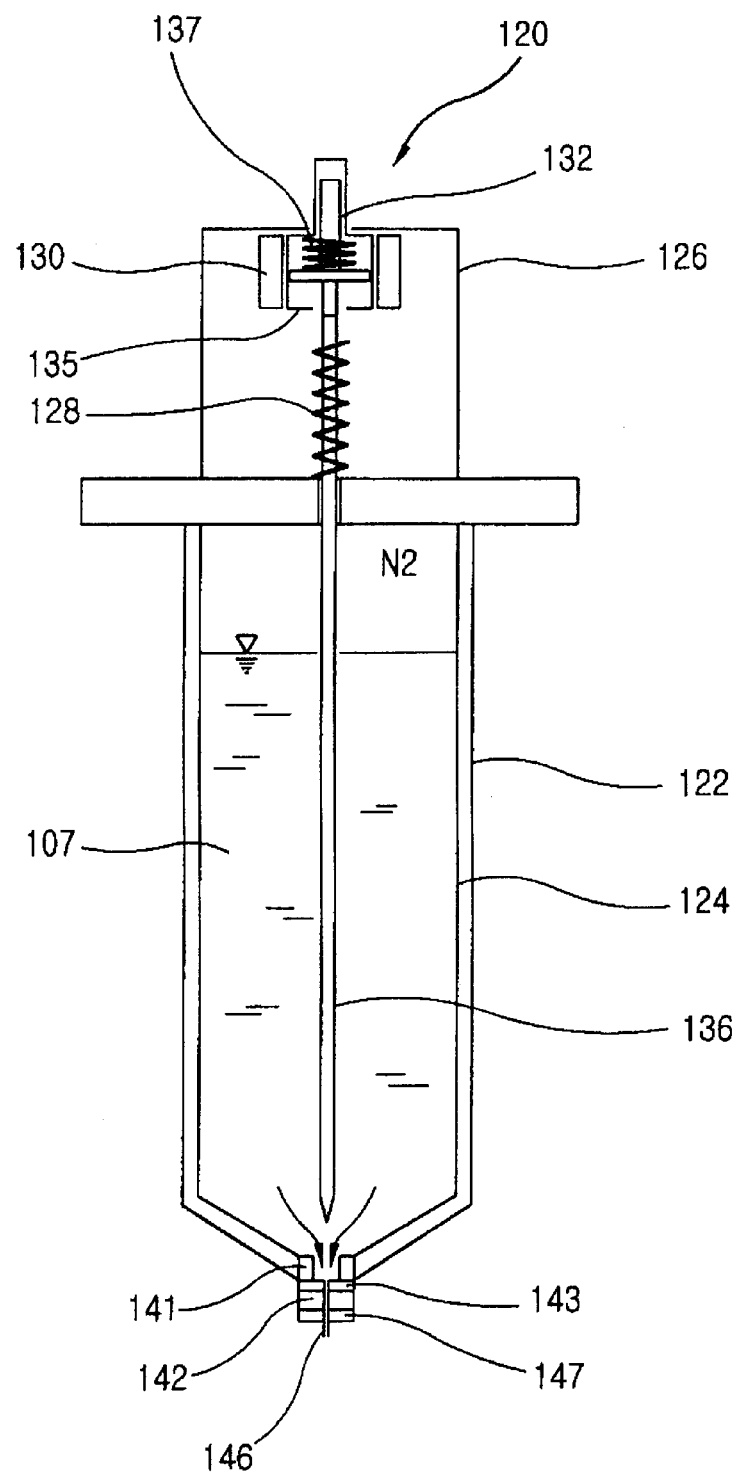
FIG. 7B is a cross sectional view of the exemplary liquid crystal dispensing apparatus during injection of liquid crystal material in accordance with the present invention.
Figure 8:
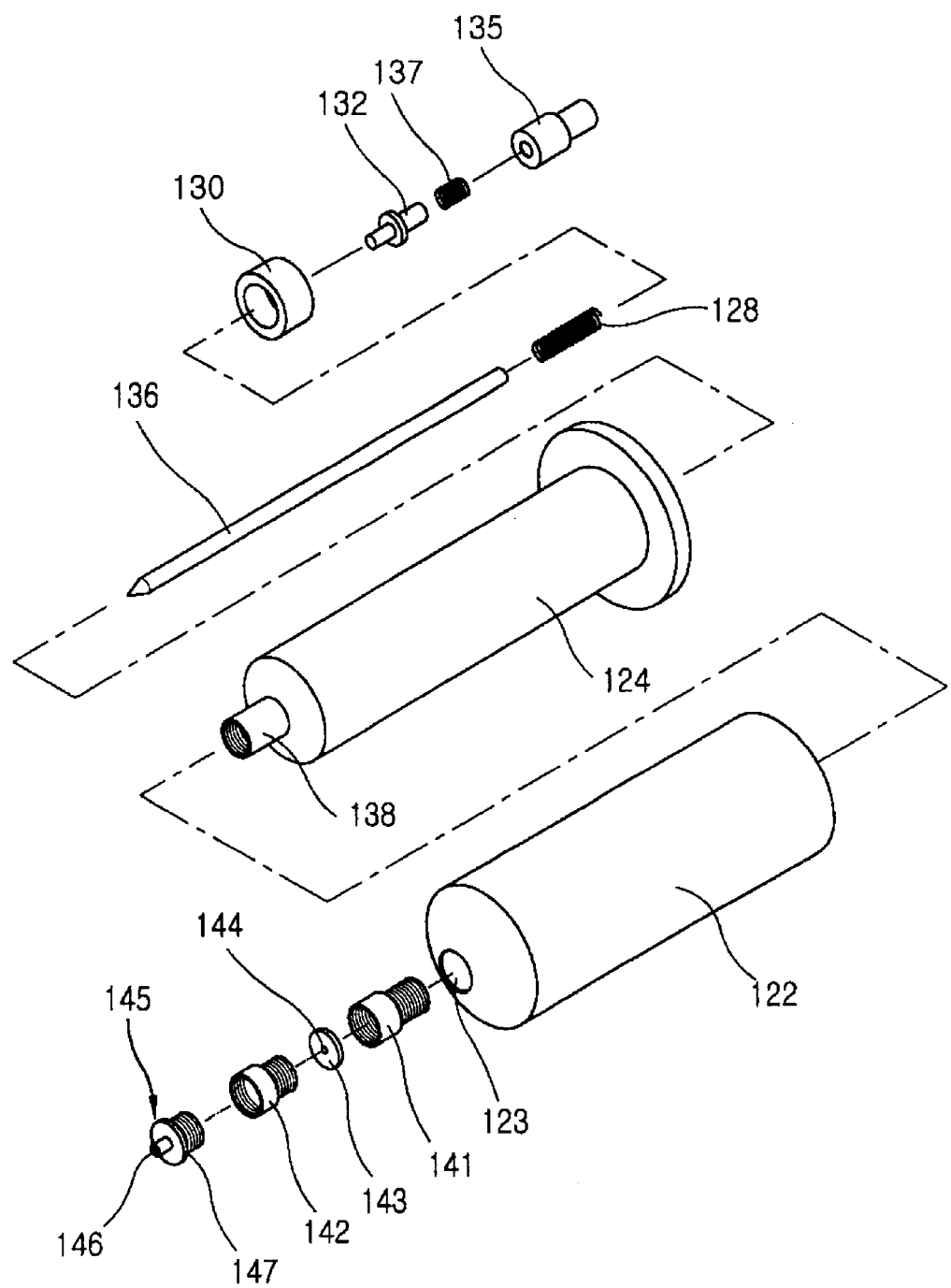
FIG. 8 is a perspective view of the exemplary liquid crystal dispensing apparatus of FIGS. 7A and 7B in accordance with the present invention.

FIG. 7A is a cross sectional view of an exemplary liquid crystal dispensing apparatus prior to injecting of liquid crystal material in accordance with the present invention, FIG. 7B is a cross sectional view of the exemplary liquid crystal dispensing apparatus during injection of liquid crystal material in accordance with the present invention, and FIG. 8 is a perspective view of the exemplary liquid crystal dispensing apparatus of FIGS. 7A and 7B in accordance with the present invention.

In FIGS. 7A, 7B, and 8, a liquid crystal dispensing apparatus 120 may include a cylindrical liquid crystal material container 124 disposed in a casing 122. The liquid crystal material container 124 may be made of polyethylene and may be filled with liquid crystal material 107, and the casing 122 may be made of stainless steel. Accordingly, since polyethylene has good processability, it can be easily fabricated into specific shapes. In addition, since polyethylene does not necessarily react with the liquid crystal material 107, it may be used as material of the liquid crystal material container 124. However, since polyethylene has low strength, it may be easily deformed by relatively weak external impact. Thus, if the liquid crystal material container 124 is made of polyethylene, any deformation may cause the liquid crystal material 107 to be inaccurately dispensed onto a surface of a substrate. Accordingly, the liquid crystal material container 124 may be disposed within the casing 122. A gas supply pipe (not shown) may be connected to an external gas supply unit (not shown) and may be installed above the liquid crystal material container 124. Gas, such as nitrogen, may be supplied from the external gas supply unit to the liquid crystal material container 124 through the gas supply pipe, wherein the gas fills a region of the liquid crystal material container 124 not filled with the liquid crystal material 107 and pressurizes the liquid crystal material 107 to be dispensed.

Alternatively, the liquid crystal material container 124 may be made of steel, such as stainless steel. Accordingly, the casing 122 may not be necessary, whereby production costs of the liquid crystal dispensing apparatus 120 may be reduced. When the liquid crystal material container 124 is made of a metal material, internal surfaces of the liquid crystal material container 124 may be coated with a fluorine resin material to prevent the liquid crystal material 107 from reacting with the metal liquid crystal material container 124.

In FIG. 8, an opening 123 may be formed at a lower end of the casing 122. When the liquid crystal material container 124 is disposed within the casing 122, a protrusion 138 may be formed at a lower end of the liquid crystal material container 124 to be inserted into the opening 123. Thus, the liquid crystal material container 124 may be combined with the casing 122. In addition, the protrusion 138 may be combined with a first combining unit 141. The protrusion 138 may include an internally threaded portion that may be combined with an externally threaded portion of the first combining unit 141.

In addition, the first combining unit 141 may include an internally threaded portion that may be combined with an externally threaded portion of a second combining unit 142. When the first and second combining units 141 and 142 are combined, a needle seat 143 may be positioned therebetween. The needle seat 143 may include a discharge hole 144 centrally formed through the needle seat 143. Accordingly, the liquid crystal material 107 within the liquid crystal material container 124 may be discharged through the discharge hole 144 after passing through the first combining unit 141.

A nozzle 145 may be combined with the second combining unit 142. The nozzle 145 may be included for dispensing relatively small amount of the liquid crystal material 107 from the liquid crystal material container 124. The nozzle 145 may be include a support portion 147 having an externally threaded portion for combining with the second combining unit 142 and a discharge hole 146 projected from the support portion 147 to drop a relatively small amount of the liquid crystal material 107 onto a surface of a substrate as a drop shape.

A discharge pipe formed within the support portion 147 of the nozzle 145 may extend from the discharge hole 146 to the discharge hole 144 of the needle seat 143. The discharge hole 146 of the nozzle 145 may have a very small diameter in order to dispense minute amounts of the liquid crystal material 107 to form small drops.

A needle 136 may be inserted into the liquid crystal material container 124, and a first end thereof may contact the needle seat 143. For example, the first end of the needle 136 contacting the needle seat 143 may be formed to be conical, wherein the first end may be inserted into the discharge hole 144 of the needle seat 143 to stop flow of the liquid crystal material 107 through the discharge pipe (not shown) of the nozzle 145.

In addition, a first spring 128 may be installed at a second end of the needle 136 disposed within an upper portion of the casing 126 of the liquid crystal dispensing apparatus 120. A magnetic bar 132 may be positioned by an interval X from the second end of the needle 136. A second spring 137 may be axially positioned on the magnetic bar 132. Accordingly, the first spring 137 may be disposed on a receiving container 135 affixed to the upper casing 126, and the magnetic bar 132 may be movably disposed within the receiving container 135. Thus, an elastic force of the second spring 137 may be applied to the magnetic bar 132.

The magnetic bar 132 may be made of a material having strong magnetism or weak magnetism, and a cylindrical solenoid coil 130 may be axially positioned at an exterior of the receiving container 135. The solenoid coil 130 may be connected to a power supply system (not shown) to induce a magnetic field to move the magnetic bar 132 along a downward direction. When power is supplied to the solenoid coil 130 and the magnetic field is induced, the magnetic bar 132 is forced along the downward direction to contact the second end of the needle 136. Accordingly, the first end of the needle 136 is moved into the discharge hole 144 of the needle seat 143, thereby preventing flow of the liquid crystal material 107 through the discharge hole 146 of the nozzle 145. Similarly, when the power supply is removed, an elastic force of the spring 128 installed at the second end of the needle 136 causes the needle 136 to move along an upward direction. Accordingly, the needle 136 is returned to an initial position, wherein the first end of the needle is removed from the discharge hole 144 of the needle seat 143, thereby permitting flow of the liquid crystal material 107 through the discharge hole 146 of the nozzle 145.

Controlling movement of the needle 136 along the upward and downward directions, which controls an opening/closing time of the discharge hole 144, is affected by the second spring 137 axially positioned on the magnetic bar 132. By supplying the power to the solenoid coil 130, the magnetic bar 132 moves along the upward direction and magnetically attracts the needle 136 in order to move the needle 136 along the upward direction, thereby contacting the magnetic bar 132. As the magnetic bar 132 moves along the upward direction, the second spring 137 is compressed by the rising magnetic bar 132. When the power to the solenoid coil 130 is removed (i.e., cut off), the magnetic field induced to the magnetic bar 132 is removed and the elastic force of the compressed second spring 137 acts on the magnetic bar 132 to move the magnetic bar 132 along the downward direction. Accordingly, the magnetic bar 132 pushes the needle 136 along the downward direction. Since movement of the needle 136 along the downward direction is accelerated by the first and second springs 128 and 137, dispensing the liquid crystal material 107 through the discharge hole 146 of the nozzle 145 may be efficiently controlled. For example, the movement of the needle 136 by the first and second springs 128 and 137 may prevent generation of dispensing errors caused by friction between the needle 136 and the liquid crystal material 107.

The liquid crystal material 107 has a relatively high viscosity in comparison with water. Accordingly, when the needle 136 moves within liquid crystal material 107, the movement of the needle 136 may be delayed due to friction between the liquid crystal material 107 and the surface of the needle 136. Thus, accurate opening times of the discharge hole 144 of the needle seat 143 may be computed by adding the movement delay of the needle 136 due to the friction of the liquid crystal material 107 as a variable. However, since an amount of the liquid crystal material 107 filling the liquid crystal material container 124 decreases during dispensing, a delay time of the needle 136 may be reduced. Accordingly, an opening time of the discharge hole 145 may also be reduced, thereby preventing accurate dispensing of an exact amount of the liquid crystal material 107.

According to the present invention, by controlling the movement of the needle 136 with two springs 128 and 137, and since a descending velocity of the needle 136 may be accelerated to overcome the friction between the liquid crystal material 107 and the surface of the needle 136, an opening time of the discharge hole 145 may be regularly fixed. Thus, an accurate amount of the liquid crystal material 107 may be dispensed.

Due to repeated cycling of the solenoid coil 130 (i.e., repeated turning OFF and ON), the first end of the needle 136 and the needle seat 143 repeatedly contact each other. Accordingly, the first end of the needle 136 and the needle seat 143 continuous impact each other and may be damaged. Thus, the first end of the needle 136 and the needle seat 143 may be formed of a material having high strength, such as hard metal, in order to prevent any impact damage.

In FIG. 7B, by opening the discharge hole 144 (in FIG. 8) of the needle seat 143, gas ($N_2$ gas) supplied into the liquid crystal material container 124 pressurizes the liquid crystal material 107, and the liquid crystal material 107 may be dispensed from the nozzle 145. An amount of the dispensed liquid crystal material 107 may vary according to an opening time of the discharge hole 144 and pressure acting on the liquid crystal material 107. The opening time may be determined according to the interval (x) between the needle 136 and the magnetic bar 132, the magnetic force of the magnetic bar 132 induced by the solenoid coil 130, and the elastic force of the spring 128 installed at second end of the needle 136. The magnetic force of the magnetic bar 132 may be adjusted by changing a total number of windings of the solenoid coil 130 axially positioned around the magnetic bar 132 and by the magnitude of the power supplied to the solenoid coil 130. The interval (x) between the second end of the needle 136 and the magnetic bar 132 may be adjusted by an interval adjustment portion (not shown) that may be installed at the end of the magnetic bar 132. Accordingly, the movement of the needle 136 may be controlled by the first spring 128 installed at the second end of the needle 136 and the second spring 137 installed at the magnetic bar 132.

Figure 9:
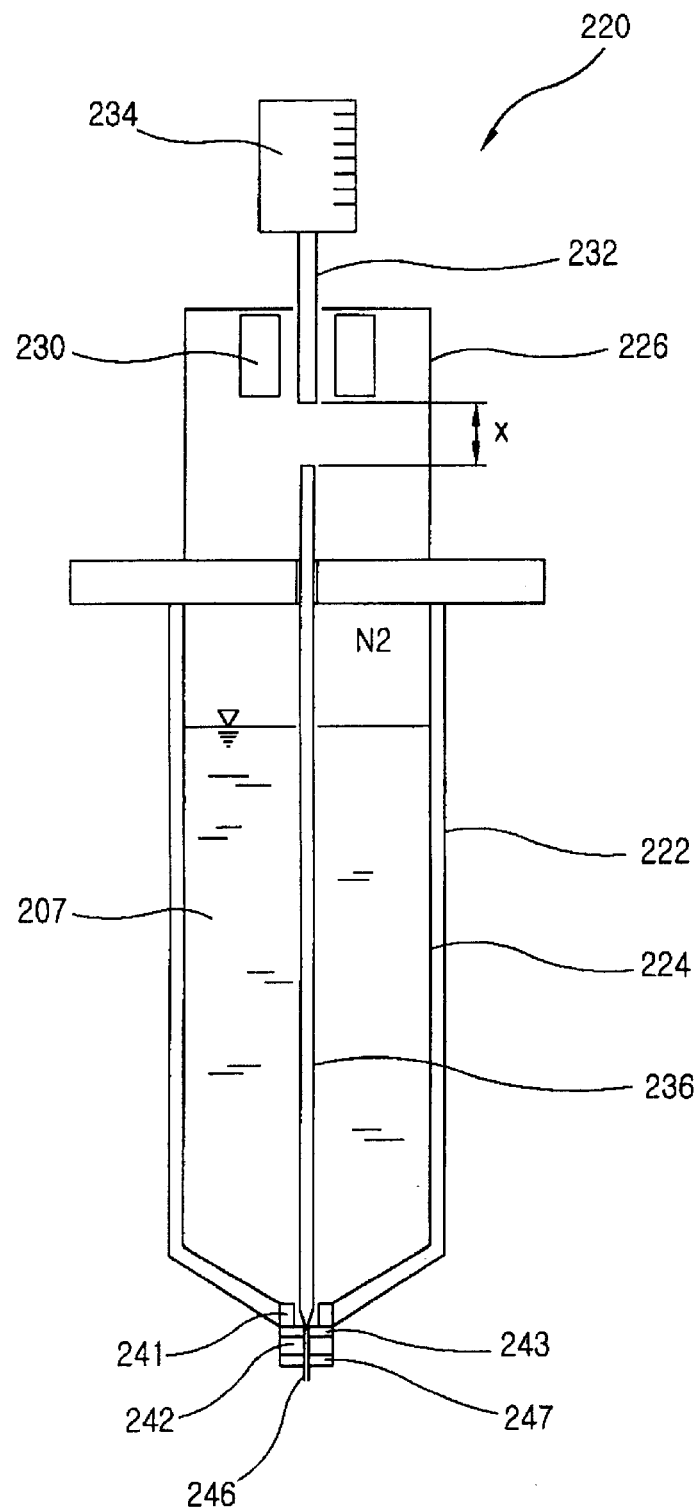
FIG. 9 is a cross sectional view of another exemplary liquid crystal dispensing apparatus in accordance with the present invention.
Figure 10:
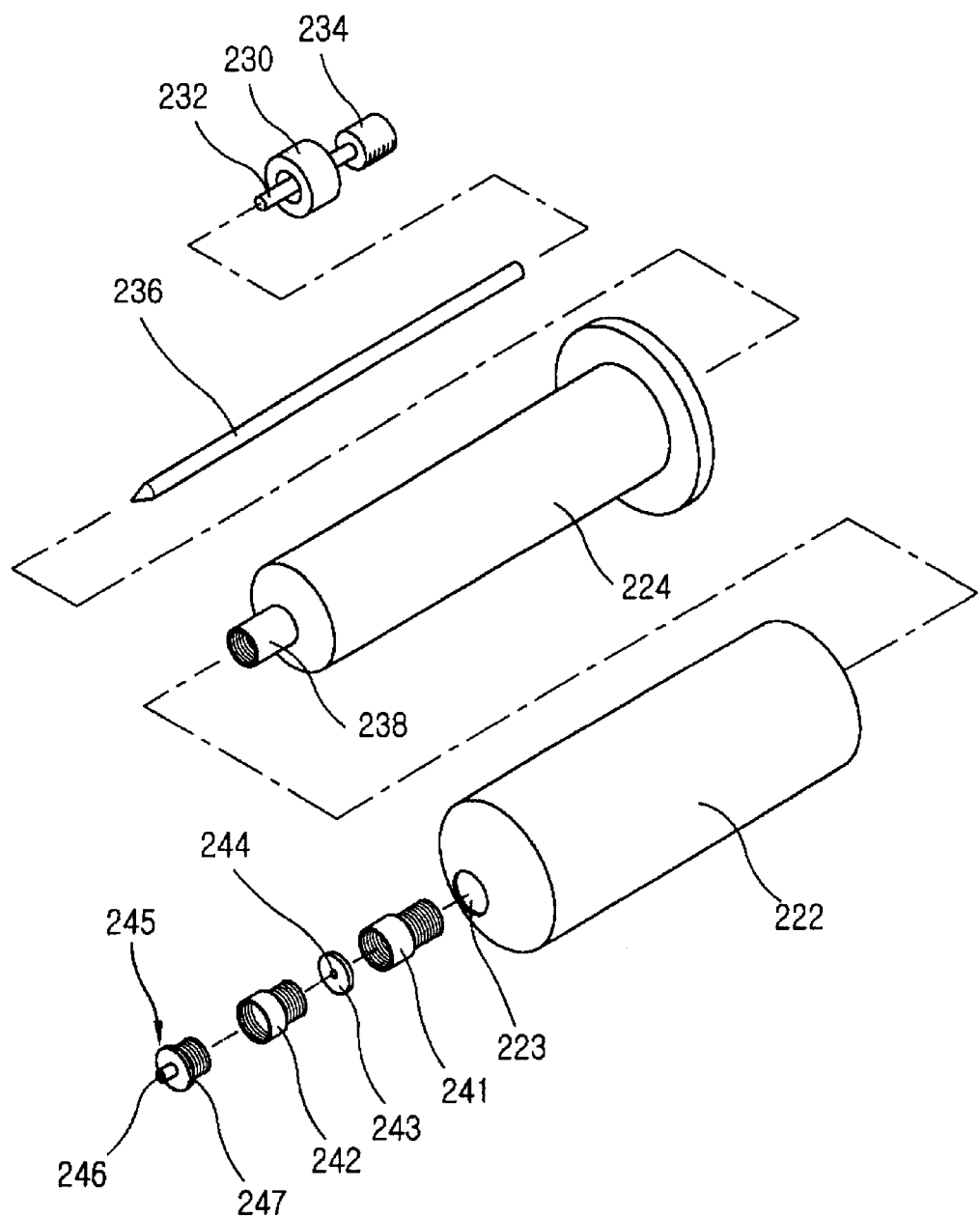
FIG. 10 is a perspective view the exemplary liquid crystal dispensing apparatus of FIG. 9 in accordance with the present invention.

FIG. 9 is a cross sectional view of another exemplary liquid crystal dispensing apparatus in accordance with the present invention, and FIG. 10 is a perspective view the exemplary liquid crystal dispensing apparatus of FIG. 9 in accordance with the present invention. In FIGS. 9 and 10, a needle seat 243 may be placed between a first combining unit 241 and a second combining unit 242 for combining the nozzle 145 with a liquid crystal material container 224. The needle seat 243 may be made of strong magnetic material having permanent magnetism. A discharge hole 244 may be formed at the needle seat 243, and liquid crystal material 207 within the liquid crystal material container 224 may be discharged through the discharge hole 244 after passing through the second combining unit 242.

A needle 236 formed of a metal material may be inserted into the liquid crystal material container 224, wherein a first end of the needle 236 contacts the needle seat 243. Accordingly, due to the permanent magnetism of the needle seat 243, the first end of the needle 236 may be firmly inserted within the discharge hole 244 of the needle seat 243. However, the needle seat 243 may not necessarily be entirely made of magnetic material. For example, only the discharge hole 244 of the needle seat 243 may be made of magnetic material, and remaining portions of the needle seat 243 may be made of materials other than magnetic materials.

Power may be supplied from an external power supply system (not shown) to a solenoid coil 230, wherein a magnetic bar 232 generates a magnetic force and the needle 236 contacts the magnetic bar 232 by the magnetic force.

When the power supply is removed (i.e., cut off), the magnetic force of the needle seat 243 attracts the first end of the needle 236 to return to an initial position (i.e., closing the discharge hole 244). Accordingly, flow of the liquid crystal material 207 through a discharge hole 244 (in FIG. 10) may be stopped.

In order to open and close the discharge hole 244 by supplying power to the solenoid coil 230, the magnetic force (electromagnetic force) formed at the magnetic bar 232 has to be greater than the magnetic force formed at the needle seat 243. If the magnetic force of the needle seat 243 is greater than the magnetic force of the magnetic bar 232, although power is supplied to the solenoid coil 230, the needle 236 may not move. Accordingly, the discharge hole 244 formed at the needle seat 243 may not open.

By controlling the movement of the needle 236 by the magnetic force generated at the first and second ends of the needle 236, an amount of the liquid crystal material 207 dispensed onto a surface of a substrate may be adjusted. For example, forming the needle seat 243 of magnetic material may not be the only way to form the magnetic force at the first end of the needle 236. By forming the first end of the needle 236 inserted into the discharge hole 244 of strong magnetic material, a permanent magnetic force may be generated and the movement of the needle 236 may be controlled.

When liquid crystal material contacts metal, a chemical reaction occurs that contaminates the liquid crystal material. Accordingly, forming the needle 236 of magnetic material may be problematic. Thus, a fluorine resin layer (TEFLON®) may be coated onto the needle seat 243 and the needle 236. By coating the needle seat 243 and the needle 236 with the fluorine resin layer, characteristics including abrasion resistance, thermal resistance, and chemical resistance may be improved on the surface of the needle 236 and contamination of liquid crystal material 207 may be prevented. In addition, since the fluorine resin has good abrasion resistance, formation of the fluorine resin layer on the first end of the needle 236 and the needle seat 243 may prevent the first end of the needle 236 and the needle seat 243 from being damaged by continuous impact. Moreover, the fluorine resin layer may be coated only on the first end of the needle 236 that actually contacts the needle seat 243, or may be coated along an entire length of the needle 236.

Figure 11:
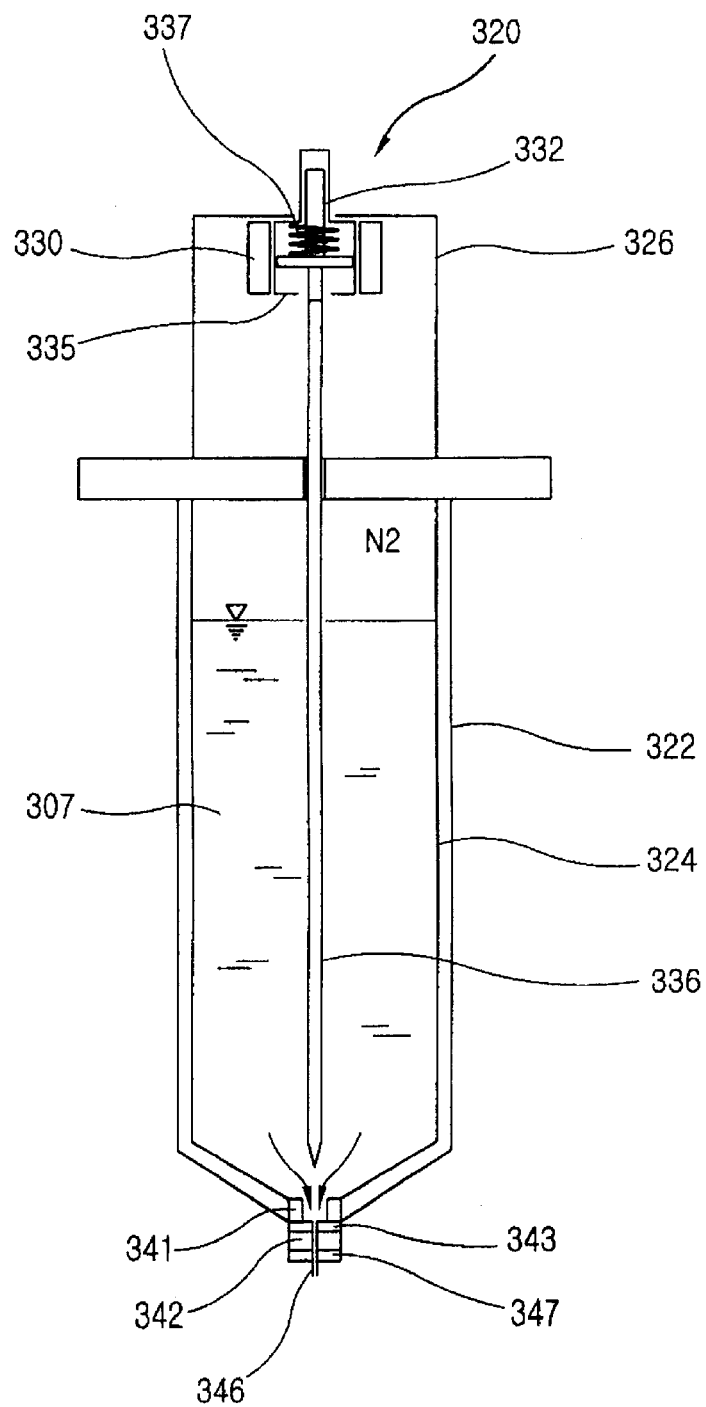
FIG. 11 is a cross sectional view of another exemplary liquid crystal dispensing apparatus in accordance with the present invention.

FIG. 11 is a cross sectional view of another exemplary liquid crystal dispensing apparatus in accordance with the present invention. In FIG. 11, a receiving container 335 may be fixed to an upper casing 326 for receiving a spring 337, thereby applying an elastic force to the magnetic bar 132. In addition, a needle 336 or a needle seat 343 may be made of magnetic material. Accordingly, when power is supplied from an external power supply system (not shown) to a solenoid coil 330, the magnetic bar 332 generates a magnetic force and the needle 336 moves along an upward direction by the magnetic force. Accordingly, liquid crystal material 307 may be dispensed through a discharge hole of the needle seat 343.

When the power supply to the solenoid coil 330 is removed (i.e., cut off), the magnetic force formed at the magnetic bar 332 is removed. Accordingly, a magnetic force may be generated at a needle seat 343 made of magnetic material, and the needle 336 may be returned to an initial position (i.e., a position contacting the needle seat 343). Since a spring 337 may be installed at a second end of the needle 336, the needle 336 may be returned more quickly by the elastic force of the spring 337. Accordingly, an opening and closing times of the discharge hole of the needle seat 343 may more precisely be controlled.

It will be apparent to those skilled in the art that various modification and variations can be made in the liquid crystal dispensing apparatus of the present invention without departing from the spirit or scope of the invention. Thus, it is intended that the present invention cover the modifications and variations of this invention provided they come within the scope of the appended claims and their equivalents.

What is claimed is:

1. A liquid crystal dispensing apparatus, comprising:

a liquid crystal material container filled with liquid crystal material a gas supply at an upper portion of the liquid crystal material container for pressurizing the liquid crystal material with gas;

a needle seat positioned at a lower portion of the liquid crystal material container and having a discharge hole for discharging the liquid crystal material of the liquid crystal material container;

a needle having first and second ends positioned within the liquid crystal material container to be movable along upward and downward directions;

a first spring positioned at a first end of the needle;

a solenoid coil positioned at the upper portion of the liquid crystal material container;

a magnetic bar positioned adjacent to the first end of the needle within the solenoid coil for moving the needle along the upward direction by generating a magnetic force when power is applied to the solenoid coil;

a second spring positioned around the magnetic bar within the magnetic coil; and a nozzle positioned at the lower portion of the liquid crystal material container for dispensing the liquid crystal material from the liquid crystal material container onto a surface of a substrate.

2. The apparatus according to claim 1, wherein the liquid crystal material container includes metal and is filled with the liquid crystal material.

3. The apparatus according to claim 1, wherein the liquid crystal material container includes an inner liquid crystal material container filled with the liquid crystal material and a casing for receiving the inner liquid crystal material container.

4. The apparatus according to claim 1, further includes a receiving container for receiving the second spring within the solenoid coil.

5. A liquid crystal dispensing apparatus, comprising:

a liquid crystal container filled with liquid crystal material;

a gas supply at an upper portion of the liquid crystal material container for pressurizing the liquid crystal material with gas;

a needle seat positioned at a lower portion of the liquid crystal container;

a discharge hole formed in the needle seat for discharging the liquid crystal material, the discharge hole having a first magnetic force;

a needle positioned within the liquid crystal material container to be movable along upward and downward directions, the needle having first and second ends such that the first end opens and closes the discharge hole according to a magnetic force formed at the second end;

a solenoid coil and a magnetic bar positioned adjacent to the second end of the needle for moving the needle along the upward direction by application of a second magnetic force to the second end of the needle; and a nozzle positioned at a lower portion of the liquid crystal material container for dispensing the liquid crystal material onto a surface of a substrate.

6. The apparatus according to claim 5, wherein the second magnetic force is greater than the first magnetic force.

7. The apparatus according to claim 5, wherein the first end of the needle includes permanent magnetic material.

8. The apparatus according to claim 5, wherein the needle seat includes permanent magnetic material.

9. The apparatus according to claim 8, wherein a circumference of the discharge hole of the needle seat includes the permanent magnetic material.

10. The apparatus according to claim 5, wherein surfaces of the needle include a fluorine resin.

11. The apparatus according to claim 10, wherein the second end of the needle includes the fluorine resin.

12. The apparatus according to claim 5, wherein a fluorine resin layer is coated onto the needle seat.

13. The apparatus according to claim 5, wherein the liquid crystal container includes metal.

14. The apparatus according to claim 5, wherein the liquid crystal container includes an inner liquid crystal material container filled with the liquid crystal material and a casing for receiving the inner liquid crystal material container.

15. A liquid crystal dispensing apparatus, comprising:

a liquid crystal material container filled with liquid crystal material and pressurized with gas supplied at an upper space of the liquid crystal material container;

a needle seat positioned at a lower portion of the liquid crystal container and having a discharge hole for discharging the liquid crystal material;

a needle positioned within the liquid crystal container to be movable along upward and downward directions, the needle having first and second ends such that the first end opens and closes the discharge hole according to a first magnetic force generated at the first and second ends of the needle;

a solenoid coil positioned above the second end of the needle;

a magnetic bar positioned above the needle for moving the needle along the upward direction by generating a second magnetic force when power is supplied to the solenoid coil; and a nozzle positioned at a lower portion of the liquid crystal container for dispensing the liquid crystal material onto a substrate having at least one panel.

* * * * *